United States Patent [19]

Clinton

[11] Patent Number: 5,612,624
[45] Date of Patent: Mar. 18, 1997

[54] APPARATUS FOR TESTING THE INSULATION OF AN ELECTRICAL CONDUCTOR

[75] Inventor: Henry H. Clinton, Clinton, Conn.

[73] Assignee: Clinton Instrument Company, Clinton, Conn.

[21] Appl. No.: 590,591

[22] Filed: Jan. 24, 1996

[51] Int. Cl.$^6$ .................................................. G01R 27/26
[52] U.S. Cl. ........................ 324/551; 324/544; 324/527
[58] Field of Search ..................................... 324/541, 544, 324/551, 557, 536, 527

[56] References Cited

U.S. PATENT DOCUMENTS

| | | | |
|---|---|---|---|
| 2,306,529 | 12/1942 | Davis | 324/544 |
| 5,066,920 | 11/1991 | Suptitz | 324/544 |
| 5,132,629 | 7/1992 | Clinton et al. | 324/544 |
| 5,276,401 | 1/1994 | Soma et al. | 324/544 |
| 5,471,144 | 11/1995 | Meyer | 324/544 |
| 5,481,198 | 1/1996 | Patel | 324/544 |

*Primary Examiner*—Maura K. Regan
*Attorney, Agent, or Firm*—McCormick, Paulding & Huber

[57] ABSTRACT

An apparatus for testing the insulation of an insulated electrical conductor has an alternating current high voltage power source which provides a high test voltage between the electrical conductor and an electrode to reveal defects in the insulation. A high Q antiresonant circuit, tuned to a predetermined frequency, is connected in series with the electrode and power source for shunting most frequency components of the corona and noise currents to ground and for non-shunting an insulation fault voltage of the predetermined frequency resulting from an arc current due to a defect in the insulation. The fault voltage signal non-shunted by the antiresonant circuit is provided through a coupling impedance to a transmission cable having a pair of twisted wires for transmission to a remote location. Impedance matching transformers, coupled to both pairs of ends of the twisted wires, are tuned to the same frequency as the antiresonant circuit to minimize attenuation of the signal. The control portion includes a detecting circuit for generating a fault indication signal in response to the voltage signal transmitted to the control portion exceeding a variable threshold value. A negative bias circuit provides a negative DC voltage dependent upon the voltage of the high test voltage to the control portion for defining the threshold voltage value.

6 Claims, 1 Drawing Sheet

APPARATUS FOR TESTING THE INSULATION OF AN ELECTRICAL CONDUCTOR

FIELD OF THE INVENTION

The present invention relates generally to fault testing of insulation applied to a cable, wire or other elongated electrical conductor, and more particularly to an improved insulation testing apparatus of the type wherein an alternating current high test voltage is applied between an electrode and the conductor to reveal holes, voids or other imperfections in the insulation.

BACKGROUND OF THE INVENTION

Insulated electrical-conductors, such as wire and cable, are usually subjected to a high voltage test prior to use as a check against any unseen imperfections which may be present in the insulation. This test may be made either as the insulation is extruded onto the conductor or may be performed in some subsequent operation. Generally, the insulated conductor, which is suitably grounded, is a passed through an electrode of some type which applies a high voltage to the outer surface of the insulation. When a hole or void is present in the insulation, an arc is generated between the electrode and the grounded conductor to provide an insulation fault signal.

A testing apparatus of this type is disclosed in U.S. Pat. No. 5,132,629 issued to Clinton wherein a test station includes the high AC voltage source and an electrode for applying the high test voltage between the outer surface of the insulation and the conductor. The test station is coupled to a remote control unit which provides a fault detection circuit for distinguishing between corona current generated by corona effects and arc current caused by a fault in the insulation of the insulated conductor.

In the AC testing of insulated wire or cable, it is desirable to be able to detect the current produced by the smallest possible arc from the electrode to the conductor through a pin hole, crevice or other imperfection in the insulation.

Additionally, it is also desirable to prevent the current due to normal corona effects which occur in the air spaces between the elements of the electrode and the insulation surface from producing erroneous indications of an insulation fault condition by the detecting means.

It is further often desirable that the control unit or fault detecting means in such testing apparatus be separate and remotely located from the testing station and the high voltage transformer used to excite the electrode by distances of up to 100 meters or more without substantially degrading the performance of the apparatus.

It is a general aim therefore of the present invention to prevent normal corona effects from erroneously being detected as an insulation fault by enhancing the sensitivity of the test apparatus to discriminate between the current of a low current fault arc and normal corona current.

It is a further aim of the present invention to be able to locate the fault detection means at some distance from the high voltage transformer without degrading the detection characteristics of the fault detection means.

SUMMARY OF THE INVENTION

According to the present invention, an apparatus for detecting imperfections in the insulation disposed about an electrical conductor comprises a high voltage AC source for producing a test voltage and a test electrode for applying the test voltage between the electrical conductor and the outer surface of the insulation. An antiresonant circuit, preferably of high Q, is connected in series with the AC source and the electrode to shunt most frequency components of the involved current to ground and to produce a relatively large voltage at the antiresonant frequency across the antiresonant circuit in response to an arc current pulse at the electrode caused by a defect in the insulation. A detecting circuit, coupled to the antiresonant circuit, discriminates between the insulation fault current at the antiresonant frequency and the corona current at the antiresonant frequency and produces an insulation fault signal indicative of the condition of the insulation. The insulation fault signal is produced when the voltage across the antiresonant circuit exceeds a threshold voltage, which threshold voltage is defined by a negative bias circuit that preferably provides a negative DC voltage dependent upon the magnitude of the AC test voltage.

In a preferred embodiment, the detecting circuit is remotely located from the antiresonant circuit by a cable having a signal transmitting twisted wire pair. A first impedance matching current transformer and a second impedance matching current transformer are connected to the ends of the twisted pair. Both of these transformers are tuned to the same frequency as is the antiresonant circuit so as to provide for minimal attenuation of the insulation condition signal during its transmission by the twisted pair.

The above and other objects and advantages of this invention will become more readily apparent when the following description is read in conjunction with the accompanying drawings.

DETAILED DESCRIPTION OF THE PREFERRED EMBODIMENT

Figure 1:
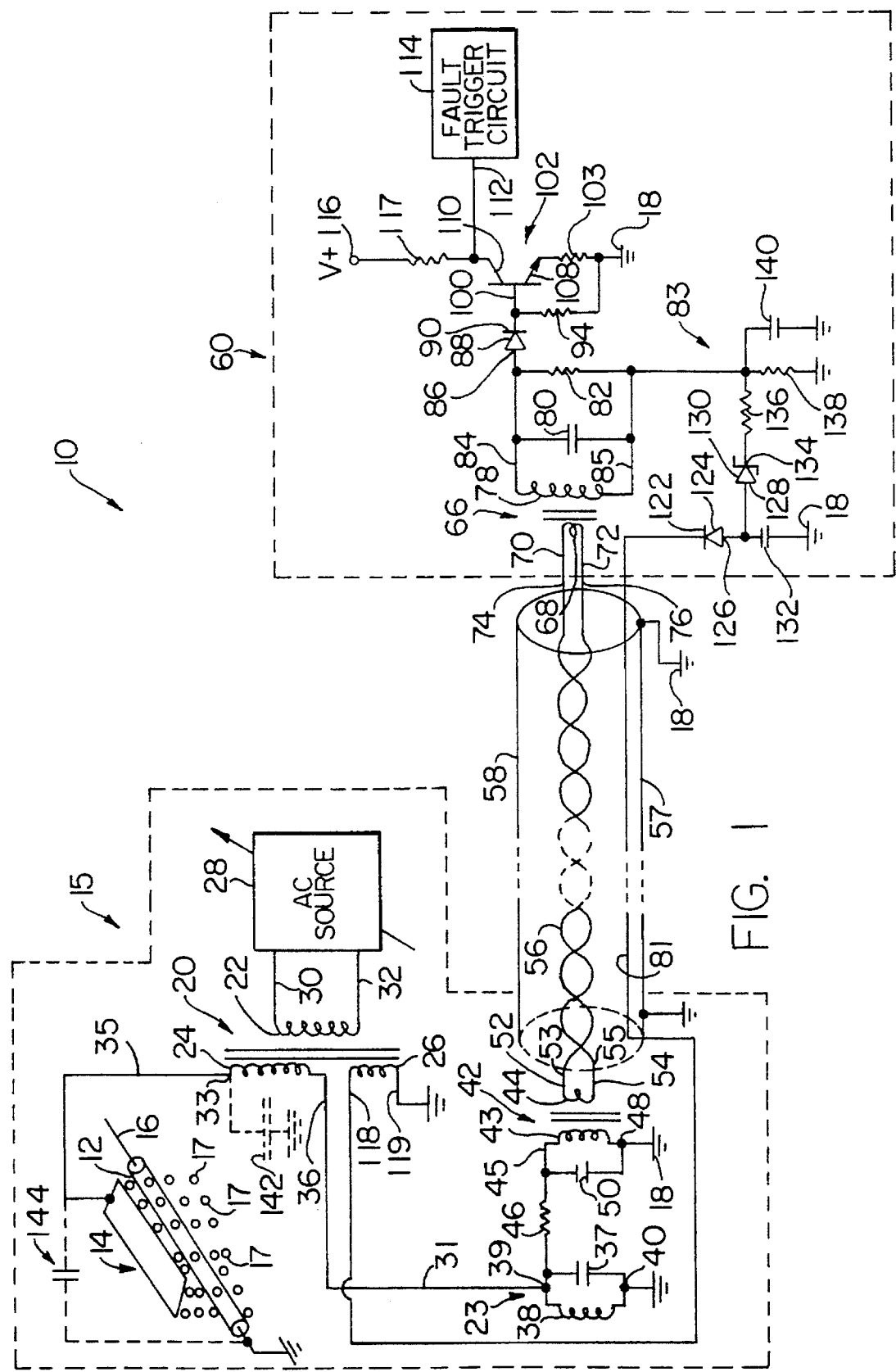
FIG. 1 is an electrical circuit schematic diagram showing one embodiment of the insulation testing apparatus of the present invention.

Turning now to the drawing and considering the invention in further detail, FIG. 1 is an electrical circuit schematic diagram of the insulation testing apparatus, generally designated at 10, of the present invention. A conductor 16 insulated by insulation 12 is passed through a test electrode 14 located at a testing station 15. The conductor 16 under test is grounded to a ground reference voltage potential 18. The test electrode 14 may take various different forms and is preferably one that contacts the insulation of the insulated conductor as it passes through the electrode. For example, the electrode may be formed by bead chains 17, as illustrated, or by brushes, rollers or other elements generally well known to those skilled in the art.

The various circuit components and parts of the testing station, other than the electrode 14, are usually contained within a protective enclosure (not shown) and include a high voltage potential transformer 20 having a primary winding 22, a high voltage secondary winding 24 and a low voltage secondary winding 26. An AC source 28 is connected across the terminals 30, 32 of the primary winding 22. The AC source may, for example, be a solid-state oscillator which is adjustable to provide an output excitation voltage at a desired test frequency and magnitude to cause the secondary winding 24 to produce a desired high voltage test potential. As an example, in one application, the AC source 28 may be adjusted to provide an output signal of approximately 20

Vrms at 3,000 Hz which is stepped up by the high voltage potential transformer 20 to approximately 15,000 Vrms at 3,000 Hz across the secondary winding 24.

One end 33 of the secondary winding 24 is connected to the electrode 14 by the conductor 35 to apply the high voltage test potential to the electrode 14. The other end 36 of the secondary winding 24 is connected through line 31 to one end of a high Q antiresonant circuit 23 composed of capacitor 37 connected in parallel with inductor 38 at node 39. The other end 40 of the antiresonant circuit is connected to ground 18. The antiresonant circuit is tuned to a frequency, for example to one in the range of 60 to 70 Khz, that minimizes attenuation and distortion of the signal produced by the antiresonant circuit as it is transmitted over a twisted wire pair 56 forming part of a long shielded transmission cable 58.

The voltage signal appearing across the antiresonant circuit is coupled, through a coupling impedance means, to the primary winding 43 of an impedance matching current transformer 42 which transforms the impedance of the signal as seen by the winding 43 to one suitable for driving the twisted pair 56 transmission line. In FIG. 1 the coupling impedance means is shown, for example, to be a resistor 46, but instead of the resistor 46, it could also be an inductance, a capacitance or a combination of two or more resistive, inductive or capacitive components.

A capacitor 50 is connected in parallel with the primary winding 43 across the terminals 45 and 48, and is selected to provide a tuned antiresonant frequency, in combination with the primary winding 43, the same as the tuned frequency of the antiresonant circuit 23.

The secondary winding 44 of the impedance matching transformer 42 has its ends 52, 54 connected to the ends 53, 55, respectively, of the twisted wire pair 56 contained within the grounded conductive sheath 57 of the cable 58. The cable 58, connects the testing station 15 to the control portion 60 of the testing apparatus, which control portion 60 is located some distance (perhaps up to 100 meters or more) from the electrode 14.

The control portion 60 includes an impedance matching current transformer 66 generally similar in design and characteristics to the transformer 42, and it transforms, through its turn ratio, the impedance of the twisted wire pair 56 to one matching that of a resistor 82 connected across its secondary winding 78. The primary winding 68 of the transformer 66 has its ends 70, 72 connected respectively to the associated ends 74, 76 of the twisted wire pair 56. A capacitor 80 and the resistor 82 are connected in parallel across the respective ends 84, 85 of the secondary winding 78 of transformer 66. The value of capacitor 80 is selected to provide, in combination with the inductance of the secondary winding 78, an antiresonant frequency the same as that of the antiresonant circuit 37.

The end 84 of the secondary winding 78 of the transformer 66 is connected to the anode 86 of a diode 88. The cathode 90 of diode 88 is connected to ground 18 through a resistor 94 and to the base terminal 100 of a NPN transistor 102. The emitter terminal 108 of transistor 102 is connected to ground 18 through resistor 103. The collector terminal 110 of the transistor 102 is connected to the input 112 of a fault trigger circuit 114 and through a resistor 117 to a terminal 116 to which a positive DC voltage potential $V_+$ is applied.

A negative DC bias voltage dependent upon the magnitude of the AC test potential is applied, by a negative biasing circuit 83, to the end 85 of the secondary winding 78 of transformer 66. This negative bias voltage is preferably, and as shown, generated from the voltage appearing across the secondary winding 26 of the transformer 20. One end 118 of the low voltage secondary winding 26 of the high voltage transformer 20 is connected through another wire 81 of the transmission cable 58 to the cathode 122 of a diode 124 in the control portion 60, and the other end 119 is connected to ground 18. The anode 126 of the diode 124 is connected to the anode 128 of a zener diode 130 and to ground 18 through a capacitor 132. The cathode 134 of the zener diode 130 is connected to a voltage divider, composed of resistors 136 and 138, with the junction therebetween being connected to the end 85 of the secondary winding 78 of transformer 66 and to ground 18 through a filter capacitor 140.

when the testing apparatus 10 is operated, the AC source 28 energizes the high voltage potential transformer 20 causing it to apply a high AC test voltage between the electrode 14 and the grounded insulated conductor 16 being tested. The involved circuit passes from the electrode 14 through the high voltage secondary winding 24 and through the antiresonant circuit 23 to ground 18, and from ground back to the conductor 16 and to the space between the insulation of the conductor 16 and the electrode.

The high Q antiresonant circuit 23 provides a high impedance between node 39 and ground 18 for current components of frequencies falling within a narrow frequency band centered about the tuned (or antiresonant) frequency of the antiresonant circuit 23, and low impedances for current components of frequencies outside that band.

If the insulation of the conductor 16 under test has no defect, current flowing in the line 31 is due in part to current flow through wiring capacitance indicated in phantom at 142, and current through a capacitance, shown in phantom at 144, representing the capacitance of the length of insulated conductor 16 within the electrode 14. Predominantly, however, the current in the line 31 consists of a corona effect component arising from the ionization of the air spaces between the bead chain elements 17,17 of the electrode 16 and the outer surface of the insulation of the electrical conductor 16 under test. The corona current is characterized by components spread over a broad frequency band and having fast rise times and low average energy content. Most of the corona current frequency components are outside the tuned frequency of the antiresonant circuit 23, and are therefore shunted to ground 18 by the circuit 23. In addition, the antiresonant circuit 23 also provides a high degree of immunity to electrical interference or noise from external sources typically found in an industrial environment by also shunting such interference to ground.

The corona current frequency component at node 39 which is at the antiresonant frequency of the circuit 37, and which therefore induces a voltage signal across the primary winding 43 of the transformer 42, is not filtered to ground 18 and is instead transmitted through the transformer 42, twisted wire pair 56, and transformer 66 to the diode 88. However, the related voltage which arrives at the diode 88 is insufficient to overcome the negative bias voltage applied to the end 85 of the secondary winding 78 by the biasing circuit 83. Therefore no current flows through the diode 88 and the trigger circuit is maintained in its non-operationed condition.

When a fault or defect in the insulation 12 of the conductor 16 appears within the electrode 14, an arc will occur from the electrode 14 to the conductor 16. The current flowing in the arc is highly dependent on the geometry of both the fault in the insulation itself and the electrode-air interface, but in any event the current of each single arc shock excites the antiresonant circuit 23 and results in a component at the antiresonant frequency appearing across the antiresonant circuit 23 and having an exponentially dampened sinusoidal waveform of initially relatively high voltage.

This high voltage waveform at the antiresonant frequency is in turn transmitted, through the transformers 42 and 66 and twisted wire pair 56, to the diode 88 where it is of sufficiently high value to overcome the negative bias of the biasing circuit 83, thereby causing current to flow through the diode 88, switching transistor 102 to a conducting state, and thereby switching fault trigger circuit 114 to its operationed state.

One advantage of the apparatus of the present invention for testing the insulation 12 of an electrical conductor 16 is that the high Q antiresonant circuit shunts most of the components of the corona discharge current and external noise currents to ground 18, to thereby reduce the likelihood of the detection means falsely indicating a defect in the insulation of the conductor. In addition, the antiresonant circuit generates a relatively high voltage signal at the tuned frequency of the circuit when an arc is generated between the conductor 16 and the electrode 14 which enhances the capability of discriminating between corona current and arc current.

Another advantage of the apparatus is that the impedance matching transformers 42, 66 are tuned to the same frequency as the frequency of the antiresonant circuit, which minimizes attenuation of the signal transmitted over the transmission twisted pair 56, to enable the control portion 60 to be located at quite some distance from the test station 15 without significantly degrading the sensitivity of the detection means.

Apparatus for testing flaws in the insulation of an electrical conductor passing through an electrode has been described above in a preferred embodiment. It will be recognized that numerous changes and modifications may be made to the values of the various circuit components and also to the configuration of the functioning circuits without departing from the scope of the invention. Therefore, the invention has been described by way of illustration rather than limitation.

I claim:

1. An apparatus for testing the insulation of an insulated conductor, said apparatus comprising:

a high voltage alternating current (AC) source for producing a test voltage at a desired magnitude and frequency across first and second points;

a test electrode connected to said first point for applying said test voltage to a portion of such insulation received within said test electrode while said conductor is grounded;

an antiresonant circuit tuned to a predetermined frequency and connected between said second point and ground for shunting to ground those components of the current flowing through said second point which are at frequencies other than said predetermined frequency, a transmission pair of wires having a first pair of ends and a second pair of ends, a first impedance matching transformer separate and apart from said antiresonant circuit and having a primary winding with first and second ends and a secondary winding connected across said first pair of ends of said pair of transmission wires, means connecting said second end of said primary winding of said first impedance matching transformer to ground, a coupling impedance means connected between said second point and said first end of said primary winding of said first impedance matching transformer, a second impedance matching transformer having a primary winding connected across said second pair of ends of said pair of transmission wires and a secondary winding, and a detecting circuit connected to said secondary winding of said second impedance matching transformer for producing a fault signal when the voltage across said secondary winding of said second impedance matching transformer exceeds a given value.

2. An apparatus for testing the insulation of an insulated conductor as defined in claim 1, wherein said antiresonant frequency circuit has a high Q characteristic centered about said predetermined tuned frequency.

3. An apparatus for testing the insulation of an insulated conductor as defined in claim 1, wherein said antiresonant circuit comprises an inductor and a capacitor connected in parallel with one another between said second point and ground.

4. An apparatus for testing the insulation of an insulated conductor as defined in claim 1, wherein said electrode includes means for contacting an outer surface of the insulation of the insulated conductor.

5. An apparatus for testing the insulation of an insulated conductor as defined in claim 1, wherein said detecting circuit comprises:

a first circuit for providing a negative bias voltage proportional to the magnitude of said high test voltage;

a circuit for applying said negative bias voltage to one end of said secondary winding of said second impedance matching transformer; and a switching circuit for producing said fault signal in response to the voltage appearing at the other end of said secondary winding of said second impedance matching transformers exceeding a given positive value.

6. An apparatus for testing the insulation of an insulated conductor as defined in claim 1, wherein said coupling impedance means is a resistor.

\* \* \* \* \*